United States Patent [19]

Kibe et al.

[11] Patent Number: 5,227,203
[45] Date of Patent: Jul. 13, 1993

[54] ION-PLATING METHOD AND APPARATUS THEREFOR

[75] Inventors: Hiroshi Kibe; Hiroshi Kagechika; Takeshi Sekiguchi, all of Tokyo, Japan

[73] Assignee: NKK Corporation, Tokyo, Japan

[21] Appl. No.: 885,512

[22] Filed: May 19, 1992

[30] Foreign Application Priority Data

Feb. 24, 1992 [JP] Japan .................................. 4-36179
Feb. 28, 1992 [JP] Japan .................................. 4-43812

[51] Int. Cl.⁵ .................................................. B05D 3/06
[52] U.S. Cl. .................................. 427/523; 118/50.1; 118/620; 118/718; 118/719; 118/720; 118/723; 118/DIG. 7; 427/249; 427/255.2; 427/255.5; 427/294; 427/530; 427/566

[58] Field of Search ................... 427/523, 249, 255.2, 427/255.5, 294, 530, 566; 118/50.1, 620, 718, 719, 720, 723, DIG. 7

Primary Examiner—Bernard Pianalto
Attorney, Agent, or Firm—Frishauf, Holtz, Goodman & Woodward

[57] ABSTRACT

An electron beam is radiated on an ion-plating material to heat and evaporate this material, thereby generating a vapor flow of the material. The vapor flow of the material is converged by a hood-like electrode, and at the same time, a positive voltage is applied to the electrode to attract thermoelectrons from the material. The vapor flow is ionized by the thermoelectrons. The converged and ionized vapor flow is deposited on a surface of a strip, thereby performing ion plating.

31 Claims, 3 Drawing Sheets

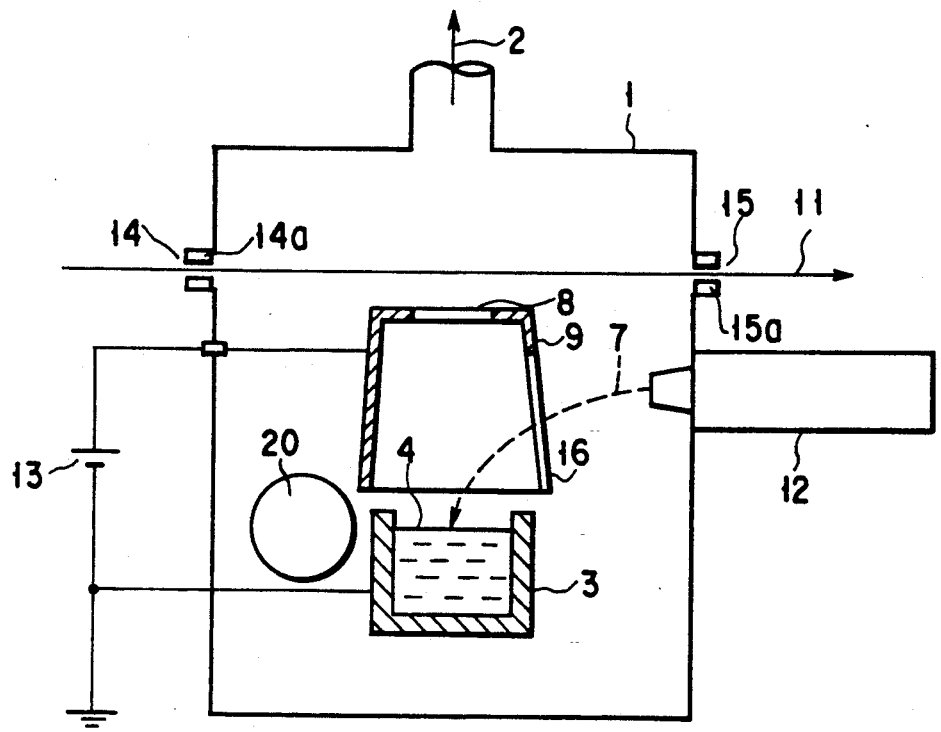
F I G. 1
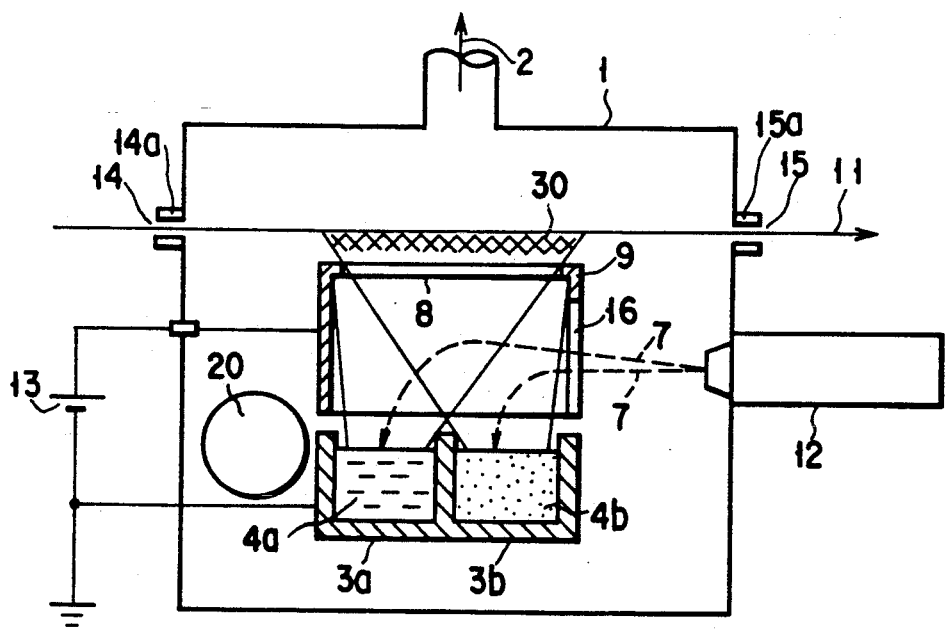
F I G. 3

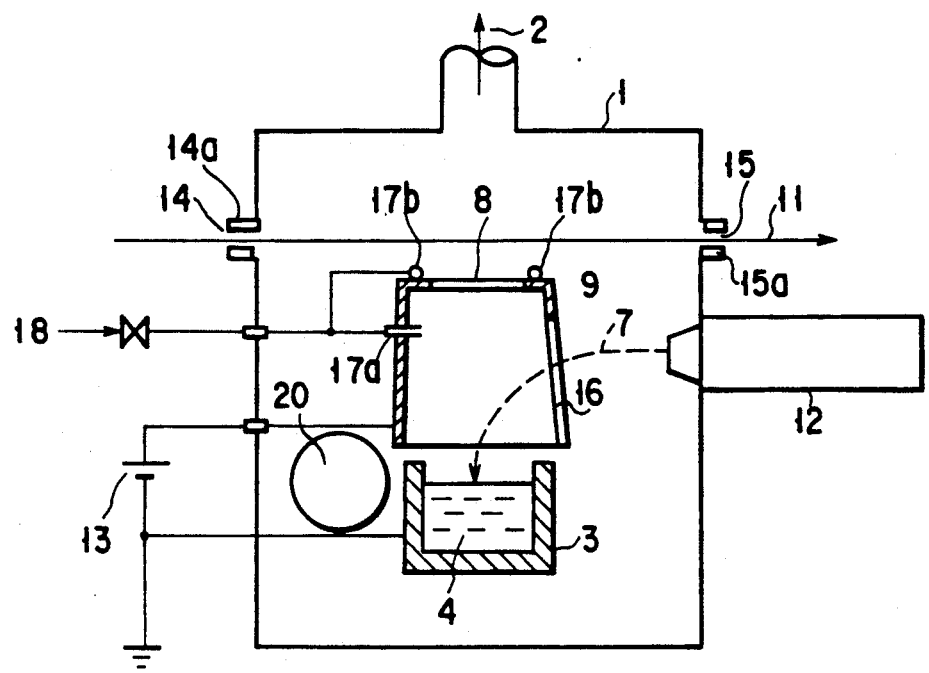
F I G. 4

ION-PLATING METHOD AND APPARATUS THEREFOR

BACKGROUND OF THE INVENTION

1. Field of the Invention

The present invention relates to an ion-plating method and an apparatus therefor and, more particularly, to an ion-plating method and an apparatus therefor suitable for forming a film on a wide substrate at high rate.

2. Description of the Related Art

In recent years, attempts have been made to form films by dry processes on wide steel strips such as cold-rolled steel strips to increase the values added. Among these attempts, ion plating is confirmed as a method excellent in adhesion and density of a film and in productivity (Material and Process, Vol. 2, PP. 1636-1637 (1989)). In order to improve productivity in ion plating, a film material must be evaporated at high rate, and a high-power electron gun is advantageously used as a heating means for the material. However, technical difficulties are experienced in ionization of the material evaporated at high rate at a high ionization ratio. No industrial method for a wide steel strip has yet been established.

In formation of a ceramic film by an ion-plating method, a metal material which is a major component of a ceramic is heated, evaporated, and ionized. At the same time, the metal ions are reacted with a reaction gas simultaneously supplied during ionization to form a ceramic film on a substrate. Among ion-plating methods, an HCD (Hollow Cathode Discharge) method is available to simultaneously perform material evaporation and ionization by using a plasma gun. This method is used as a reactive ion-plating method because it has a high ionization ratio. However, since he deposition rate of this method is on the order of one-tenth μm/min, most of the practical systems are small-scale batch systems. An economical disadvantage is inevitably caused when this method is applied to continuous process equipment for a strip.

Published Examined Japanese Patent Application No. 57-57553 proposes a method using an electron gun as a heating mean and arranging a positive electrode near a crucible to improve the ionization ratio and film quality. According to this method, however, since a discharge becomes unstable during film formation at high rate, the method is applied to only small-scale batch systems. It is, therefore, difficult to ion-plate a strip having a large area at high rate by using a wide crucible.

Published Unexamined Japanese Patent Application No. 57-155369 proposes a method of converging vapor particles by a hood located above a crucible and ionizing the vapor particles by a positive electrode and a filament which are located in an upper portion of the hood. According to this method, a stable discharge can be obtained even during high rate evaporation. However, the lifetime of the filament is short, and this method cannot be applied to a practical continuous apparatus.

As shown schematically in FIG. 5, U.S. Pat. No. 4,828,872 (DE 3627 151 A1) proposes a method in which a crucible 3 is entirely covered with a inner chamber 6 having an upper opening 8, and a vapor flow from the opening 8 is ionized by a positive electrode 9 located above the opening 8. According to this method, a stable discharge is obtained even during high rate evaporation, and the arrangement shown in FIG. 5 can withstand a long-term operation. However, since the distance between the electrode 9 above the inner chamber 6 and the crucible 3 is large, thermoelectrons generated by a vapor material 4 cannot be sufficiently accelerated. For this reason, the ionization ratio of the vapor particles is not sufficiently high. In particular, the ionization ratio is largely reduced during high rate evaporation.

SUMMARY OF THE INVENTION

The present inventors have made extensive studies in consideration of the above problems and have achieved the present invention in which a hood-like electrode having a function of converging a vapor flow above a crucible is located when a vapor material in the crucible is to be heated and evaporated by an electron gun and is to be ionized by a positive electrode, thereby stabilizing discharge and increasing the ionization ratio even during high rate evaporation with a simple structure.

It is an object of the present invention to provide an ion-plating method and an apparatus therefor, in which a simple structure is used to ion-plate a strip on a large industrial scale and especially a wide strip stably at high deposition rate and a high ionization ratio, thereby forming high-quality metal, alloy, and ceramic films on the traveling strip.

According to the present invention, there is provided an ion-plating method for a traveling strip, comprising the steps of: radiating an electron beam on at least one material to heat and evaporate the material and hence generate a vapor flow of the material; causing a hood-like electrode to converge the vapor flow of the material; applying a positive voltage to the hood-like electrode to attract thermoelectrons from the material and causing the thermoelectrons to ionize the vapor flow; and depositing the converged and ionized vapor flow on the strip. In addition, when a ceramic film is to be formed on the strip, a reaction gas is supplied inside the electrode, and the reaction gas flowing in the electrode is ionized together with the vapor flow, thereby depositing the resultant compound on the strip as a ceramic film.

According to the present invention, there is further provided an ion-plating apparatus comprising:

a vacuum chamber for passing a strip therethrough, held in a vacuum atmosphere and having an inlet and an outlet through which a strip to be ion-plated passes in the vacuum chamber;

a crucible located below the strip in the vacuum chamber, for containing an ion-plating material therein;

radiating means for radiating an electron beam on the material to heat and evaporate the material;

an electrode located above the crucible and below the strip in the vacuum chamber and having a hood-like shape for covering an upper portion of the crucibler, the electrode having an opening, formed at a lower portion of the electrode, for receiving the heated and evaporated material and an opening, formed at an upper portion of the electrode, for discharging the heated and evaporated material toward a direction of the strip; and a DC power supply having a positive terminal connected to the electrode and a negative terminal connected to the crucibler. The apparatus for forming a ceramic film on a strip further has an inlet for receiving a reaction gas.

According to the present invention, since the hood-like electrode is located above the crucible, diffusion of the vapor flow can be prevented. In particular, vapor disturbance caused by a surface state of the vapor material during high rate evaporation can be suppressed, so that a discharge can be stabilized. In addition, even if the vapor pressure on the surface of the vapor material greatly increases during high rate evaporation, and the mean free path of thermoelectrons generated from the surface of the vapor material becomes short, the thermoelectrons can be sufficiently accelerated to maintain a high ionization ratio because one end of the electrode is located near the crucible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention FIG. 1 is a schematic view showing an ion-plating apparatus according to Example 1 of the present invention;

FIG. 3 is a schematic view showing an ion-plating apparatus according to Example 2 of the present invention;

FIG. 4 is a schematic view showing an ion-plating apparatus according to Example 3 of the present invention.

DETAILED DESCRIPTION OF THE PREFERRED EMBODIMENTS

Example 1

Figure 2:
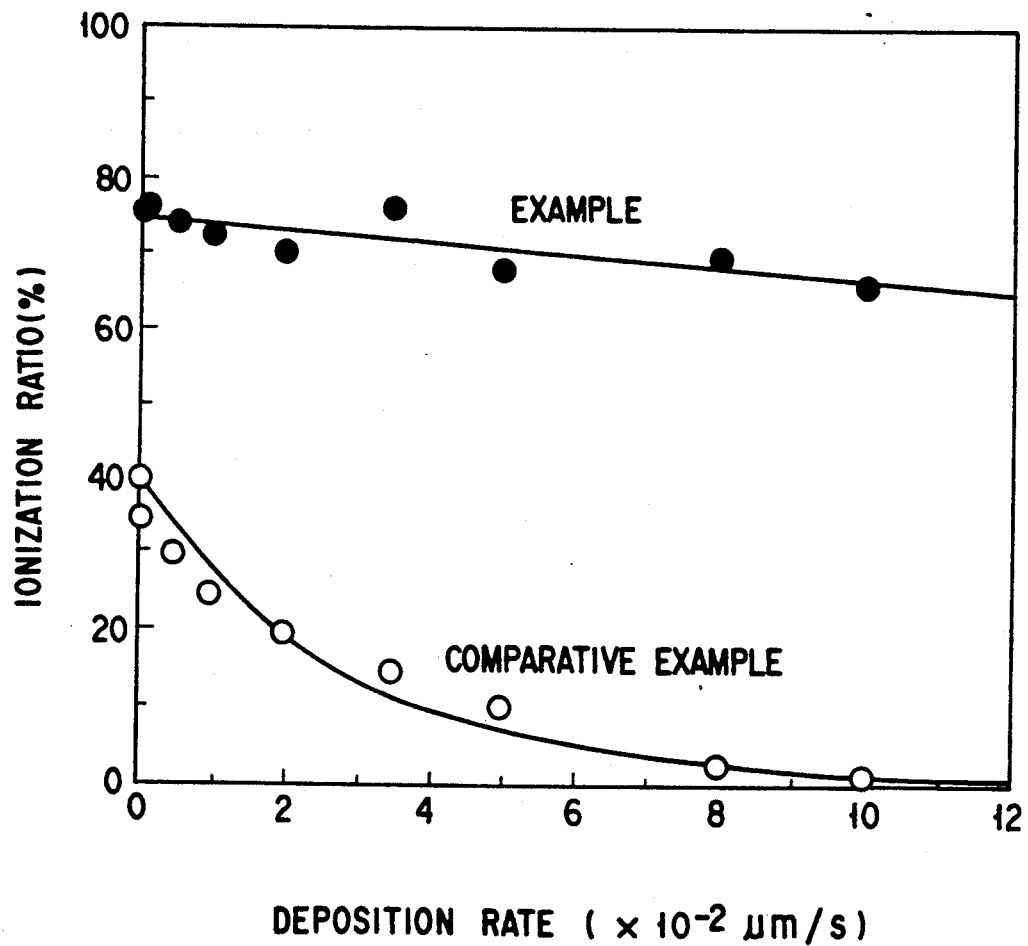
FIG. 2 is a graph showing a relationship between the deposition rates and ionization ratios when the apparatus of Example 1 and a conventional apparatus of the comparative example are used.

The present invention will be described in detail by ways of an example shown in FIG. 1. An illustrated ion-plating apparatus is used for continuous ion-plating process of a traveling strip 11. Examples of the preferable strip 11 are a low-carbon steel strip, a stainless steel strip, a magnetic steel strip, an Fe-Ni alloy thin plate, an Aλ thin plate, and a Ti thin plate. If the apparatus includes an appropriate cooling mechanism, the apparatus can be applied to a polymer film or the like. The material of the strip to be processed y the apparatus is not therefore limited to a specific one. This apparatus comprises a vacuum chamber 1 for maintaining a vacuum atmosphere. The vacuum chamber 1 has an inlet 14 and an outlet 15 at its upper portion. The strip 11 travels extending through the vacuum chamber 1. The inlet 14 and the outlet 15 have vacuum seals 14a and 15a for maintaining a vacuum during travel of the strip 11. The vacuum seals 14a and 15a need not be used if the pressure in a vacuum chamber adjacent to the vacuum tank 1 is almost equal to that of the vacuum chamber 1. An evacuation system 2 is arranged above the vacuum chamber 1 to maintain an ion-plating enable vacuum falling within the range of 1 Pa to $1 \times 10^{-3}$ Pa. A crucible 3 is located in the lower portion of the vacuum chamber 1, and a vapor material 4 is stored in the crucible 3. The width of the crucible 3 is equal to or larger than the width of the strip 11. Examples of the preferable vapor material are Ni, Co, Fe, Ti, Zr, Ta, V and Hf. Other preferable vapor materials are Cr, Mn, and the like. An electron gun 12 is mounted at one side of the vacuum chamber 1. An electron beam 7 emitted from the electron gun 12 is deflected by a magnetic field generator 20, and the deflected electron beam is incident on the surface of the vapor material 4. A hood-like electrode 9 is arranged between the crucible 3 and the strip 11. The lower portion of the electrode 9 is open to the crucible 3. The hood-like electrode 9 is tapered narrower toward its upper portion. The upper portion has an opening 8. The opening 8 faces the strip 11. The width of the opening 8 is equal to or larger than the width of the strip 11. An opening 16 is formed in the side portion of the electrode 9, so that the electron beam passes through the opening 16. The material of the electrode 9 is preferably copper having a water cooling mechanism so as to withstand heat radiated from the crucible 3 and heat generated during ionization. The side opening 1 through which the electron beam passes is not essential. If the electron beam 7 is incident on the vapor material 4 through a space between the electrode 9 and the crucible 3, the side opening 16 can be omitted. The positive terminal of a DC power source 13 is connected to the electrode 9, and the negative terminal of the DC power source 13 is connected to the crucible 3.

In this apparatus, the electron beam 7 is emitted from the electron gun 13 and is deflected by the magnetic field generator 20. The deflected electron beam 7 is incident on the crucible 3 located at the lower central portion of the vacuum chamber 1 to heat and evaporate the vapor material 4. An output from the electron gun 12 has a power of, e.g., 40 to 600 kW. The vapor flow of this material is converged into the hood-like electrode 9. A positive voltage is applied to the electrode 9, and the vapor flow is ionized by thermoelectrons generated from the vapor material 4. The voltage applied to the electrode 9 falls within the range of, e.g., 15 to 100 V, and the ionization ratio. The ionized metal vapor is converged by the electrode 9 and is deposited on the upper strip 11 through the upper opening 8 of the electrode 9, thereby forming a metal film on the strip 11. At this time, when a negative voltage is kept applied to the strip 11, the ionized vapor particles are accelerated toward the strip 11, so that the adhesion of the film can be increased and formability can be improved. The voltage applied to the strip 11 preferably falls within the range of −50 to −1,000 V.

In this apparatus, since the hood-like electrode 9 is arranged above the crucible 3, diffusion of the vapor flow can be prevented. In particular, vapor disturbance caused by a surface state of the vapor material during high rate evaporation can be suppressed, so that a discharge can be stabilized. In addition, since the electrode 9 itself has a function of a hood, the structure can be simplified to contribute to stability for a long period of time. Since one end of the hood-like electrode is located near the crucible, the electrons can be sufficiently accelerated even at a shorter mean free path of thermoelectrons generated from the surface of the vapor material, thereby maintaining a high ionization ratio.

Figure 5:
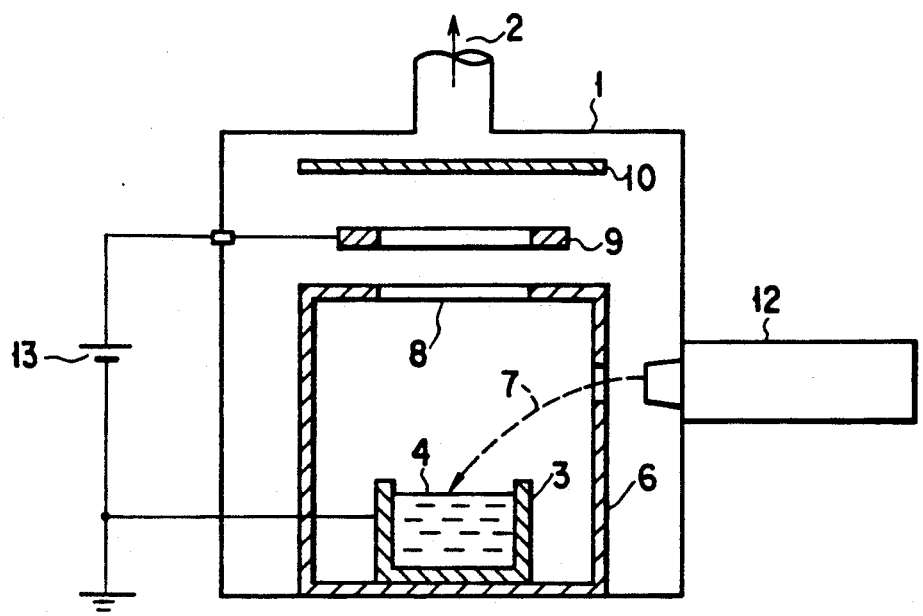
FIG. 5 is a schematic view showing an apparatus disclosed in U.S. Pat. No. 4,828,872 (DE 3627 151 A1).

FIG. 2 is a graph showing a relationship between the deposition rates and ionization ratios when the apparatus shown in FIG. 1 and the apparatus shown in FIG. 5 are used. In this case, the vapor material was Ti, and the electron gun output was changed in the range of 40 to 150 kW. The voltage applied to the electrode fell within the range of +30 to +50 V. The ionization ratios were calculated in accordance with current values flowing through the substrates. As can be apparent from FIG. 2, when the deposition rate is increased, the ionization ratio is abruptly decreased in the conventional method. To the contrary, a higher ionization ratio than that of the conventional method can be maintained even during high rate deposition according to the present invention.

Example 2

An ion-plating apparatus shown in FIG. 3 is basically the same as that of the apparatus in FIG. 1 except for the following structure. That is, at least two crucibles 3a and 3b are aligned in a lower portion inside a vacuum chamber 1 in a traveling direction of a strip 11. Materials 4a and 4b to be evaporated and containing components of an alloy film to be formed by ion plating are stored in the crucibles 3a and 3b, respectively. Examples of the suitable vapor materials 4a and 4b are Ti, Hf, Ta, W, V, Zr, Ni, Co, Fe, Cr, Al, Mn, and Zn. Among these materials, a refractory metal having a large number of thermoelectrons generated during heating and evaporation is suitable as the vapor material. However, the vapor materials are not limited to these materials. A compound (e.g., a nitride, oxide, or carbide) except for metals can be used in accordance with a desired alloy. The width of each of the crucibles 3a and 3b is equal to or larger than that of the strip 11.

An electron gun 12 is mounted on one side of the vacuum chamber 1. An electron beam 7 is deflected toward the crucibles by a deflection magnetic field generated by a magnetic field generator 20. The deflected electron beam is alternately radiated on the surfaces of the vapor materials 4a and 4b. The electron beam preferably comprises a Pierce type electron gun when the electron beam is radiated on a plurality of crucibles. Two or more electron guns, which are not limited to the Pierce type electron guns, may be used.

A hood-like electrode 9 is arranged between the crucibles 3a and 3b and the strip 11. The electrode 9 has the same cross-sectional area from the lower opening to the upper portion thereof. The electrode 9 has a side opening 16 through which the electron beam 7 passes, and an upper opening 8. The side opening 16 through which the electron beam 7 passes is not essential. For example, this opening can be omitted when the electron beam 7 is alternately radiated on the vapor materials 4a and 4b through a space defined between the electrode 9 and the crucibles 3a and 3b. The width of the upper opening 8 is equal to or larger than the width of the strip 11. The positive terminal of a DC power source 13 is connected to the electrode 9, and the negative terminal of the DC power source 13 is connected to the crucibles 3a and 3b. At the same time, the crucibles 3a and 3b are grounded.

In this apparatus, the electron beam 7 is alternately radiated from the electron gun 12 onto the vapor materials 4a and 4b in the crucibles 3a and 3b located in the vacuum chamber 1 to simultaneously evaporate the vapor materials 4a and 4b. An optimal scanning mode is checked so that the film thickness distribution in the direction of width of the strip becomes uniform and at the same time the resultant film has a desired composition. The electron beam 7 is radiated in this scanning mode. The thermoelectrons generated by the vapor materials 4a and 4b are accelerated by the electrode 9 applied with the positive voltage and are bombarded against the vapor particles to ionize the vapor particles. At this time, an magnetic field for deflecting the electron beam has an effect of increasing a probability of bombardment between the thermoelectrons and the vapor particles by trapping the thermoelectrons, thereby accelerating ionization. The ionized material vapors are converged by the hood-like electrode 9 and mixed in a gaseous phase, and an alloy vapor 30 is deposited on the strip 11. As a result, an alloy film is formed on the strip 11. At this time, a negative voltage is kept applied to the strip 11 to increase the adhesion of the film and improve formability because the ionized vapor particles are accelerated toward the strip 11. Examples of the alloy of the alloy film formed on the strip are preferably Ti-Cr, Ti-Ni, Ti-Al, Co-Cr, and Zn-Mg. These alloys are alloys poor in adhesion and formability according to the conventional method.

In this apparatus, since the hood-like electrode 9 is arranged above the crucibles 3a and 3b, diffusion of the vapor flow can be prevented. In particular, vapor disturbance caused by a surface state of the vapor material during evaporation at high speed can be suppressed, so that a discharge can be stabilized. In addition, since the electrode 9 itself has a function of a hood, the structure can be simplified to contribute to stability for a long period of time. Since one end of the hood-like electrode is located near the crucible, the electrons can be sufficiently accelerated even at a shorter mean free path of thermoelectrons generated from the surface of the vapor material, thereby maintaining a high ionization rate Comparison between an ion-plating result of an alloy film formed using the apparatus of FIG. 3 and a comparative apparatus (FIG. 5) having two crucibles in place of one crucible will be described below. In this case, a stainless steel strip was used as a strip, and vapor materials were Ti and Cr. Radiation times of the electron beam incident on Ti and Cr were determined in accordance with a relationship with alloy compositions in a preliminary experiment. A voltage applied to the electrode 9 was set to be +50 V. The ionization ratio was calculated in accordance with the deposition rate and the current flowing through a strip during ion plating. A voltage of −100 V was applied to the strip.

Ion plating was performed with a 80 kW output from the electron gun in the apparatus of the present invention, the deposition rate was 8 μm/min, and the ionization ratio was 35%. At this time, the deposition rate of the comparative apparatus was almost equal to that of the apparatus of the present invention. However, the ionization ratio of the comparative apparatus was 8%.

When ion plating was performed with a 150 kW output from the electron gun, the deposition rate of the apparatus of the present invention was 20 μm/min, and its ionization rate was 28%. To the contrary, the ionization ratio of the comparative apparatus was decreased to 3%.

The test results of adhesion and formability of alloy films and the test results of films formed by vacuum deposition are summarized in Table 1. As is apparent from Table 1, the alloy films formed by ion plating using the apparatus of the present invention have higher ionization ratios even by high rate deposition and have higher adhesion and better formability than those of the comparative examples.

In Example 2, two crucibles are located adjacent to each other. However, three or more crucibles ay be arranged adjacent to each other.

Example 3

An ion-plating apparatus shown in FIG. 4 is used to form a ceramic film on a surface of a strip. A vapor material 4 in a crucible 3 is one of components constituting a ceramic film and is exemplified by Ti, Hf, Ta, W, V, Zr, Ni, Co, Fe, Cr, Al, Mn, Mg, or Zn. Of these materials, a refractory metal having a large number of thermoelectrons generated during heating and evaporation is suitable as a vapor material. However, the vapor materials are not limited to these materials. A compound (e.g., a nitride, oxide, or carbide) except for metals can be used in accordance with a desired alloy. The number of crucibles is not limited to one. A plurality of crucibles may be arranged adjacent to each other, and different materials may be simultaneously evaporated to form a ceramic containing two or more metal components. The width of the crucible 3 is preferably equal to or larger than that of the strip.

An electron gun 12 is mounted on one side of a vacuum chamber 1. An electron beam 7 is deflected toward the crucible by a deflection magnetic field generated by a magnetic field generator 20. The deflected electron beam is incident on the surface of the vapor material 4. The electron gun 12 preferably comprises a Pierce type electron gun stably operated even if the pressure in the vacuum chamber 1 is increased upon supply of a reaction gas.

A hood-like electrode 9 is arranged between the crucible 3 and a strip 11. This structure is basically the same as that of FIG. 1. The same reference numerals as in FIG. 1 denote the same parts in FIG. 4, and a detailed description thereof will be omitted. Note that this electrode 9 has inlets 17a and 17b, formed at the side and upper portions thereof, for receiving a reaction gas 18, so that the reaction gas 18 is supplied to the interior an upper portion of the hood-like electrode 9. The distal end of each of the gas inlets 17a and 17b has a metal restrictor mechanism. A water cooling mechanism is arranged, as needed. Gas pipes up to the gas inlets are made of an insulating material. The reaction gas 18 supplied from the gas inlets 17a and 17b contains at least one component constituting a target ceramic. Examples of this component can be $N_2$, $O_2$, $CH_4$, $C_2H_2$, $H_2$, and any gas can be determined in accordance with the target ceramic film. The number of components is not limited to one. Two or more gases may be mixed to obtain a composite compound to form, e.g., a film of a carbonitride.

In this apparatus, the electron beam 7 from the electron gun 12 is incident on the vapor material 4 stored in the crucible 3 located in the vacuum chamber 1 to evaporate the vapor material 4. An optimal scanning mode of the electron beam 7 is checked so that the film thickness distribution in the direction of width of the strip becomes uniform. The electron beam 7 is radiated in this scanning mode. Thermoelectrons generated by the vapor material 4 are accelerated by the electrode 9 applied with a positive voltage and are bombarded against the vapor particles and the reaction gas to ionize the vapor particles and the reaction gas. At this time, a magnetic field for deflecting the electron beam has an effect of increasing a probability of bombardment between the thermoelectrons, the vapor particles, and the reaction gas by trapping the thermoelectrons, thereby accelerating ionization. The ionized material vapor and reaction gas are converged by the hood-like electrode and are reacted with each other into a compound. This compound is deposited on the strip 11. At this time, a negative voltage is kept applied to the strip 11 to accelerate the ionized vapor particles and reaction gas toward the strip 11 so as to accelerate the reaction, increase the adhesion of the film, and improve formability. In this manner the compound film such as, a ceramic film is formed on the strip 11. Examples of the film formation ceramic are preferably TiN, TiC, CrN, TiArN, TiCrN, and TiCN.

In this apparatus, since the hood-like electrode 9 is arranged above the crucible 3, diffusion of the vapor flow can be prevented. In particular, vapor disturbance caused by a surface state of the vapor material during high rate evaporation can be suppressed, so that a discharge can be stabilized. In addition, since one end of the hood-like electrode is located near the crucible, the vapor pressure and the pressure of the reaction gas on the surface of the vapor material can be increased during high rate deposition, so that the electrons can be sufficiently accelerated, a high ionization ratio can be maintained, and the reaction between the vapor particles and the reaction gas can be accelerated even at a shorter mean free path of thermoelectrons generated by the vapor material and the reflected electrons of the electron beam.

Comparison between an ion-plating result of a compound film formed using the apparatus shown in FIG. 4 and that using a comparative apparatus (FIG. 5) in which reaction gas inlets are additionally formed will be described below. A stainless steel was used as a strip, Ti was used as a vapor material, and $N_2$ was used as a reaction gas. A voltage of +50 V was applied to the electrode 9, and a voltage of −100 V was applied to the strip.

When ion plating was performed with a 120 kW output from the electron gun and an electrode current of 1,250 A in the apparatus shown in FIG. 4, a gold film, which color was unique to TiN, was formed at a deposition rate of 9 $\mu$m/min. During deposition for three hours, no abnormal discharge occurred, and the discharge was stabile. The resultant film had a dense structure having a smooth surface in accordance with an SEM (Scanning Electron Microscope) observation. The adhesion of the film in a scratch test was 7 kgf, and the Vickers hardness was 2,200 kg/mm$^2$.

On the other hand, when film formation was performed using the comparative apparatus at the same deposition rate, a maximum electrode current was 750 A, and the color of the resultant film was dark brown. According to an SEM observation, the film had a brittle structure with a rough surface. The adhesion of the film in a scratch test was 3.5 kgf, and the Vickers hardness was 850 kg/mm$^2$. This film was inferior to that of Example 3.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

TABLE 1

| No. | Film | Composition (at %) | Deposition Rate | Deposition Method | Ionization Ratio | Adhesion | Formability | Remarks |
|---|---|---|---|---|---|---|---|---|
| 1 | Ti—Cr alloy | 90–10 | 8 μm/min | IP | 35% | ○ | ○ | Example of Present Invention |
| 2 | Ti—Cr alloy | 90–10 | 8 μm/min | IP | 8% | ○ | x | Comparative Example |
| 3 | Ti—Cr alloy | 90–10 | 8 μm/min | VD | 0% | △ | x | Comparative Example |
| 4 | Ti—Cr alloy | 90–10 | 20 μm/min | IP | 28% | ○ | ○ | Example of Present Invention |
| 5 | Ti—Cr alloy | 90–10 | 20 μm/min | IP | 3% | △ | x | Comparative Example |
| 6 | Ti—Cr alloy | 90–10 | 20 μm/min | VD | 0% | △ | x | Comparative Example |

IP: Ion plating
VD: Vacuum deposition
The adhesion strength was evaluated by the degree of peeling after each sample was bent at 180° and subjected to a tape peel test.
Formability was evaluated by the degree of cracking after each sample was subjected to 0t contact bending and an SEM observation of a bent portion.

What is claimed is:

1. An ion-plating method on a strip comprising the steps of:
   radiating an electron beam on an ion-plating material to heat and evaporate said ion-plating material and hence generate a vapor flow of said ion-plating material;
   causing a hood-like electrode to converge the vapor flow of said ion-plating material;
   applying a positive voltage to said hood-like electrode to generate thermoelectrons from said ion-plating material and causing the thermoelectrons to ionize the vapor flow; and
   depositing the converged and ionized vapor flow on a surface of the strip.

2. A method according to claim 1, wherein the method is performed in a vacuum atmosphere having a vacuum falling within a range of 1 Pa to $1 \times 10^{-3}$ Pa.

3. A method according to claim 1, wherein the voltage applied to said hood-like electrode falls within a range of +15 to +100 V.

4. A method according to claim 1, wherein the strip is applied with a voltage falling within a range of −50 V to −1,000 V.

5. An ion-plating apparatus comprising:
   a vacuum chamber for passing a strip therethrough, held in a vacuum atmosphere and having an inlet and an outlet through which the strip to be ion-plated passes in said vacuum chamber;
   a crucible located below the strip in said vacuum chamber, for containing an ion-plating material therein;
   radiating means for radiating an electron beam on said material to heat and evaporate said material;
   an electrode located above said crucible and below the strip in said vacuum chamber and having a hood-like shape for covering an upper portion of said container means, said electrode having an opening, formed at a lower portion of said electrode, for receiving the heated and evaporated material and an opening, formed at an upper portion of said electrode, for discharging the heated and evaporated material toward a direction of the strip; and
   a DC power supply having a positive terminal connected to said electrode and a negative terminal connected to said crucible.

6. An apparatus according to claim 5, wherein said inlet and said outlet of said vacuum chamber are sealed so that an interior of said vacuum chamber is held in a vacuum atmosphere during travel of the strip.

7. An apparatus according to claim 5, wherein said crucible has a width of not less than that of the strip.

8. An apparatus according to claim 5, wherein said radiating means is mounted on a side portion of said vacuum chamber.

9. An apparatus according to claim 5, wherein said electrode has a shape tapered from a large-diameter lower portion facing said container means to be narrower toward an upper portion thereof.

10. An apparatus according to claim 5, further comprising magnetic field generating means for reflecting the electron beam toward said container means.

11. A method of ion-plating an alloy film on a traveling strip, comprising the steps of:
    radiating an electron beam on at least two different ion-plating materials to heat and evaporate said ion-plating materials and hence generate vapor flows of said ion-plating materials, said two different ion-plating materials constituting components of the alloy film;
    causing a hood-like electrode to converge the vapor flows of said ion-plating materials;
    applying a positive voltage to said hood-like electrode to simultaneously generate vapor particles of said at least two ion-plating materials and ionizing the vapor particles; and
    depositing the converged and ionized vapor particles on a surface of the strip, thereby forming the alloy film on the surface of the strip.

12. A method according to claim 11, wherein the method is performed in a vacuum atmosphere having a vacuum falling within a range of 1 Pa to $1 \times 10^{-3}$ Pa.

13. A method according to claim 11, wherein the voltage applied to said hood-like electrode falls within a range of +15 to +100 V.

14. A method according to claim 11, wherein the strip is applied with a voltage falling within a range of −50 V to −1,000 V.

15. An ion-plating apparatus comprising:
    a vacuum chamber for passing a strip therethrough, held in a vacuum atmosphere and having an inlet and an outlet through which the strip to be ion-plated passes in said vacuum chamber;
    at least two crucibles located below the strip in said vacuum chamber, for containing ion-plating materials therein, said ion-plating materials constituting components of an alloy film formed on the strip;

radiating means for radiating an electron beam on said materials to heat and evaporate said materials;

an electrode located above said crucibles and below the strip in said vacuum chamber and having a hood-like shape for covering upper portions of said crucibles, said electrode having an opening, formed at a lower portion of said electrode, for receiving the heated and evaporated materials and an opening, formed at an upper portion of said electrode, for discharging the heated and evaporated materials toward a direction of the strip; and a DC power supply having a positive terminal connected to said electrode and a negative terminal connected to said crucibles.

16. An apparatus according to claim 15, wherein said vacuum chamber is held in a vacuum atmosphere having a vacuum falling within a range of 1 Pa to $1 \times 10^{-3}$ Pa.

17. An apparatus according to claim 15, wherein said inlet and said outlet of said vacuum chamber are sealed so that an interior of said vacuum chamber is held in a vacuum atmosphere.

18. An apparatus according to claim 15, wherein said crucibles each has a width of not less than that o the strip.

19. An apparatus according to claim 15, wherein said radiating means is mounted on a side portion of said vacuum chamber.

20. An apparatus according to claim 15, wherein said electrode has a shape tapered from a large-diameter lower portion facing said crucibles to be narrower toward an upper portion thereof.

21. An apparatus according to claim 15, further comprising magnetic field generating means for deflecting the electron beam toward said crucibles.

22. A method of ion-plating a ceramic film on a traveling strip, comprising the steps of:

radiating an electron beam on an ion-plating material to heat and evaporate said ion-plating material and hence generate vapor particles of said ion-plating material;

causing a hood-like electrode to converge the vapor particles of said ion-plating material;

supplying a reaction gas into said hood-like electrode;

applying a positive voltage to said hood-like electrode to ionize the vapor particles and the reaction gas; and depositing the ionized vapor particles and the ionized reaction gas on the strip and forming the ceramic a film on the strip.

23. A method according to claim 22, wherein the method is performed in a vacuum atmosphere having a vacuum falling within a range of 10 Pa to $1 \times 10^{-2}$ Pa.

24. A method according to claim 22, wherein the voltage applied to said electrode falls within a range of $+15$ to $+100$ V.

25. A method according to claim 22, wherein the strip is applied with a voltage falling within a range of $-50$ V to $-1,000$ V.

26. An ion-plating apparatus comprising:

a vacuum chamber for passing a strip therethrough, held in a vacuum atmosphere and having an inlet and an outlet through which the strip to be ion-plated passes in said vacuum chamber;

a crucible located below the strip in said vacuum chamber for containing ion-plating materials therein, said ion-plating materials constituting components of a ceramic film formed on the strip;

radiating means for radiating an electron beam on said materials to heat and evaporate said materials;

an electrode located above said crucible and below the strip in said vacuum chamber and having a hood-like shape for covering upper portions of said crucible, said electrode having an opening, formed at a lower portion of said electrode, for receiving the heated and evaporated materials and an opening, formed at an upper portion of said electrode, for discharging the heated and evaporated materials toward a direction of the strip, and said electrode having a reaction gas inlet for a reaction gas; and a DC power supply having a positive terminal connected to said electrode and a negative terminal connected to said crucible.

27. An apparatus according to claim 26, wherein said vacuum chamber is held in a vacuum atmosphere having a vacuum falling within a range of 10 Pa to $1 \times 10^{-2}$ Pa.

28. An apparatus according to claim 26, wherein said inlet and said outlet of said vacuum chamber are sealed so that an interior of said vacuum chamber is held in a vacuum atmosphere.

29. An apparatus according to claim 26, wherein said crucible has a width of not less than that of the strip.

30. An apparatus according to claim 26, wherein said radiating means is mounted on a side portion of said vacuum chamber.

31. An apparatus according to claim 26, further comprising magnetic field generating means for deflecting the electron beam toward said crucible.

* * * * *

UNITED STATES PATENT AND TRADEMARK OFFICE
CERTIFICATE OF CORRECTION

PATENT NO. : 5,227,203
DATED : July 13, 1993
INVENTOR(S) : KIBE et al

It is certified that error appears in the above-indentified patent and that said Letters Patent is hereby corrected as shown below:

On the Title Page:

Insert Under --Section [56] REFERENCES CITED

U.S. PATENT DOCUMENTS 4,828,872  5/1989  Bauer et al

FOREIGN PATENT DOCUMENTS 57-57553   12/1982  Japan
57-155369  9/1982   Japan

OTHER PUBLICATIONS

CAMP-ISIJ, Vol. 2 (1989) pages 1636-1637, "Effects of Ion Plating on Formability of Metal Files"--.

Signed and Sealed this

Twentieth Day of February, 1996

Attest:

BRUCE LEHMAN

Attesting Officer

Commissioner of Patents and Trademarks